United States Patent
Kondow et al.

Patent Number: 5,300,793
Date of Patent: Apr. 5, 1994

[54] HETERO CRYSTALLINE STRUCTURE AND SEMICONDUCTOR DEVICE USING IT

[75] Inventors: Masahiko Kondow, Kokubunji; Shigekazu Minagawa; Takashi Kajimura, both of Tokyo, all of Japan

[73] Assignee: Hitachi, Ltd, Tokyo, Japan

[21] Appl. No.: 63,054

[22] Filed: May 19, 1993

Related U.S. Application Data

[63] Continuation of Ser. No. 759,150, Sep. 11, 1991, abandoned, which is a continuation of Ser. No. 646,524, Jan. 25, 1991, abandoned, which is a continuation of Ser. No. 470,419, Jan. 29, 1990, abandoned, which is a continuation of Ser. No. 281,347, Dec. 8, 1988, abandoned.

[30] Foreign Application Priority Data

Dec. 11, 1987 [JP] Japan ............... 62-311915

[51] Int. Cl.$^5$ .............................. H01L 29/04
[52] U.S. Cl. ........................ 257/12; 257/76; 257/78; 257/200; 257/613; 257/614; 257/615; 257/627
[58] Field of Search ............... 357/16, 60, 4, 17, 59; 358/213.11; 420/580; 437/5; 257/12, 15, 18, 22, 76, 78, 183, 188, 200, 201, 613, 614, 615, 627, 628; 372/43, 45; 252/62.3 GA, 62.3 ZB, 62.3 ZT, 62.3 V

[56] References Cited

U.S. PATENT DOCUMENTS

| | | | |
|---|---|---|---|
| 3,927,385 | 12/1975 | Pratt, Jr. | 357/16 |
| 4,122,407 | 10/1978 | VanVechten | 357/16 |
| 4,439,399 | 3/1984 | Hawrylo | 420/580 |
| 4,697,202 | 9/1987 | Sher | 357/41 |
| 4,774,194 | 9/1988 | Hokuyou | 437/5 |
| 4,795,501 | 6/1989 | Stanbery | 437/5 |
| 4,866,489 | 8/1989 | Yokogawa et al. | 357/4 |

FOREIGN PATENT DOCUMENTS 58-170069 10/1983 Japan.
61-102083 5/1986 Japan.

OTHER PUBLICATIONS

Mizuta et al "Low Temperature Growth of GaN and AlN on GaAs Utilizing Metalorganics and Hydrazine" *Jap J Appl. Phys.* vol. 25 (12) Dec. 1986, pp. L945–L948.

Kittel *"Introduction to Solid State Physics"* 5th Ed. Chapter 1, pp. 26–28 (©1976) John Wiley & Sons, ed N.Y.

Fujita et al "Cubic ZnCdS Lattice-Matched to GaAs: A Novel material for Short-Wavelength Optoelectronic Applications" *Jap. J. Appl Phys* vol. 28, No. 6, Jun. 1989, pp. L898–L900.

Kittel *"Introduction to Solid State Physics"* Chapter 18 Dislocations and Crystal Growth J. Wiley & Sons, Ed. N.Y. 5th Edition p. 585.

Kukimoto, H. Proceeding of the 29th Spring 1982 meeting of Japan Society of Applied Physics and Related Societies (J.S. Appl. Phys) Tokyo 4E5, p. 748, Ghandhi, S. K. "VLSI Fabrication Principles" J. Wiley & Sons Inc. N.Y. (1983) pp. 12–14.

Sze, S. M. "Physics of Semiconductor Devices" (2nd Ed.) John Wiley & Sons Inc. N.Y. (1982) pp. 848.

*Primary Examiner*—Sara W. Crane
*Attorney, Agent, or Firm*—Antonelli, Terry, Stout & Kraus

[57] ABSTRACT

A hetero crystalline structure consisting of semiconductor materials of a zincblende-structure and wurtzite-structure. For example, formed on a semiconductor substrate having a crystal face of (100) of the zincblende structure is a semiconductor material of the wurtzite-structure in its bulk state as a film of the same zincblende-structure as the semiconductor substrate.

21 Claims, 3 Drawing Sheets

HETERO CRYSTALLINE STRUCTURE AND SEMICONDUCTOR DEVICE USING IT

This application is a continuation of application Ser. No. 07/759,150, filed Sep. 11, 1991, (now abandoned) which is a continuation of Ser. No. 07/646,524, filed Jan. 15, 1991 (now abandoned), which is a continuation of application Ser. No. 470,419, filed Jan. 29, 1990 (now abandoned), which is a continuation of application Ser. No. 281,347, filed Dec. 8, 1988 (now abandoned).

BACKGROUND OF THE INVENTION

The present invention relates to a hetero crystalline structure and a semiconductor device using it. This hetero crystalline structure is applied to a semiconductor device using a hetero-junction such as a semiconductor laser device.

As disclosed in "Proceedings of the 29th spring meeting of the Japan Society of Applied Physics and related societies (The Japan Society of Applied Physics, Tokyo, 1892)" 4p-E-5, p748, by Hiroshi Kukimoto, a compound semiconductor and alloy semiconductor have two crystalline structure types a zincblende-structure and a wurtzite-structure, but most of the crystals actually used in a semiconductor device are of the zincblende-structure. On the other hand, many of the wurtzite-structure crystals have a wide bandgap so that they are expected to be used as materials of a visible-light-emitting laser, etc.

An object of the present invention is to provide a hetero crystalline structure constructed of semiconductor materials of the zincblende-structure and the wurtzite structure in their bulk state and a semiconductor device using this.

SUMMARY OF THE INVENTION

The hetero crystalline structure according to the present invention has a structure consisting of a semiconductor single crystal substrate and a semiconductor thin film formed thereon which has the same crystalline structure as the semiconductor single crystal substrate but is made of a different material from that of the semiconductor single crystal substrate, and forms a hetero-junction together therewith. In this case, the semiconductor thin film is made of a semiconductor material the crystalline structure of which is different, in its bulk state, from that of the semiconductor single crystal substrate.

This feature is very important for the present invention. Such a semiconductor material has a crystalline structure which is different, in its ordinary bulk state, from that of the substrate, or can have a plurality of crystalline structures (e.g. wurtzite-structure, zincblende-structure), one of the crystal structures being dominant in the ordinary condition.

Typical examples of such semiconductor materials are II-VI compound semiconductor materials such as ZnS, CdS, CdSe, or the alloy thereof, etc. These II-VI compound semiconductor materials has the wurtzite-structure or dominantly take the wurtzite-structure. Also, some of III-V compound semiconductors (e.g. nitrides such as GaN, AlN, the alloy thereof, etc.) take the wurtzite-structure.

The above object of the present invention can be attained by using, as a semiconductor single crystal substrate, semiconductor material of the zincblende-structure and forming, on the substrate, a semiconductor thin film which is of the wurtzite-structure or dominantly has the wurtzite-structure in its bulk state, in the same zincblende structure as the semiconductor single crystal substrate. Typical examples of the above semiconductor single crystal substrate are III-V compound semiconductor materials such as GaAs, InP, etc.

On the contrary, the semiconductor single crystal substrate may also be of the wurtzite-structure and the semiconductor thin film epitaxially grown thereon may also be of the zincblende-structure in its bulk state.

Incidentally, the semiconductor single crystal substrate may be an epitaxial layer formed on a semiconductor substrate for epitaxial growth.

A typical technique for fabricating the above hetero crystalline structure is an atomic layer epitaxy (hereinafter abbreviated to "ALE"). The ALE technique supplies alternately in time sequence anion atoms and cation atoms to a growing surface in a solid state.

FIGS. 1 and 2 show the zincblende-structure and the wurtzite-structure, respectively.

The epitaxial growth is characterized by coincidence of a substrate with an epitaxially grown film in their atomic arrangement at the interface therebetween. The ordinary epitaxial growth inherently satisfies the condition of the atomic arrangement at the interface since the materials of the substrate and the epitaxially grown film are selected to have the same crystalline structure at their bulk state.

In the case where the crystal structure of the epitaxially grown film is different from that of the semiconductor substrate, only the following two cases satisfy the above condition of the atomic arrangement at the interface. One is the case where the crystal face of the substrate is in a (111) orientation of the zincblende-structure. In this case, the epitaxial growth film of the wurtzite-structure grows in a C-axis direction. The other is the case where the crystal face of the substrate is in a (001) orientation of the wurtzite-structure. In this case, the epitaxial growth film of the zincblende-structure grows in a [111]-axis direction.

Further, the present invention also permits the epitaxial growth to be carried out on the substrate having another crystal face. Explanation will be given for the case where the semiconductor material having a wurtzite-structure as shown in FIG. 2 in the bulk state is formed on the (100) crystal face of a zincblende-structure crystal to provide a hetero-junction therebetween.

FIG. 3 shows a model of the atomic arrangement in the epitaxial growth on the (100) face of the zincblende-structure crystal. The atomic arrangement on the (100) face before the epitaxial growth includes anion atoms. Thereafter, if cation atoms are supplied through the ALE technique, the anion atoms are bonded to the supplied cation atoms as shown in FIG. 3. Subsequently, if anion atoms are supplied, the supplied anion atoms are bonded to the previously bonded cation atoms. By repeating the same process, an epitaxial film of the zincblende-structure will be formed on the zincblende-structure crystal.

The ALE technique is conductive to the present invention since it has generally a very slow growth rate of 5 Å/sec. or less. This very slow growth rate is due to the fact that anion atoms and cation atoms are separately and slowly supplied to the substrate surface so that the bonding probability of the supplied atoms to each other is much lower than that of the supplied atoms to the anion atoms or cation atoms on the substrate. Further, the reason why the supplied anion atoms (or cation atoms) are bonded to the cation atoms (or anion atoms) on the substrate surface having a different crystal structure in the bulk state is that there is a small difference between the zincblende-structure and wurtzite-structure in their free energy so that there is not also a great difference in their stability therebetween. Actually, ZnS, CdS, BN, etc. take both crystal structures.

Both zincblende-structure and wurtzite-structure are of a tetrahedral configuration. The difference therebetween is that as shown in FIG. 4 the positions of third nearest neighboring atoms 6 and 6' in the respective crystal structures viewed from the atom indicated by numeral 3 are out of phase by 60° from each other. FIG. 4 shows a superposition of atoms 1, 2, 3, 4, 5 and 6 extracted from FIG. 1 on atoms 1, 2, 3, 4, 5 and 6' extracted from FIG. 2. As seen from FIG. 4, both crystal structures have entirely the same atomic arrangement with respect to the atoms 1, 2, 3, 4 and 5. Only the atoms 6 and 6' are displaced by 60° from each other around the atom 5. Therefore, there is not a great difference between both crystal structures in their stability.

Further, the energy band structure, which is mainly decided through interaction between the first nearest neighboring atoms and is little influenced by a difference in the positions of the third nearest neighboring atoms, does not show a great difference between both crystal structures. In the case of ZnS, both crystal structures are of a direct transition type and have closely neighboring band gaps of 3.6 eV (zincblende-structure) and 3.8 eV (wurtzite-structure). Therefore, even when the semiconductor material having a wurtzite-structure in its bulk state is converted into the zincblende-structure through the epitaxial growth, this semiconductor material of the zincblende-structure has a bandgap which is not so different from the wurtzite-structure.

Besides, the substrate and the epitaxial growth film should have equal average lattice constants. Therefore, if an alloy semiconductor or super-lattice semiconductor is to be used for the epitaxial layer, it is necessary to adjust the alloy ratio or the period of the super-lattice semiconductor by Vegard's law.

As understood from the foregoing explanation, the ALE technique providing slow epitaxial growth permits epitaxial growth in the crystal structure converted from the bulk state, thereby realizing a hetero crystalline juncture according to the present invention. Further, since the slow crystal growth can realize the hetero crystalline juncture according to the present invention, MBE (molecular beam epitaxy) and OMVPE (organometallic vapor phase epitaxy) techniques, which simultaneously supply anion atoms and cation atoms, can realize the hetero crystalline juncture according to the present invention providing that the supply speed is made as slow as 5 Å/sec. or less.

The liquid phase epitaxial growth technique which is most prevalently used at present has a growth speed as fast as 1000 Å/sec. Therefore, a large amount of anion atoms and cation atoms are simultaneously supplied to the growing surface. Thus, the probability that the supplied anion atoms and cation atoms are bonded with each other is much higher than the probability that the supplied cation atoms (or anion atoms) are bonded to the anion atoms (or cation atoms) on the growing surface, thus making it impossible to realize intended epitaxial growth.

In accordance with the present invention, a hetero-junction between the materials having different crystal structures in their bulk states which can not inherently provide a desired hetero-junction can be obtained. Thus, it is possible to eliminate one of the limitations encountered in designing a semiconductor device using such a heterojunction.

DESCRIPTION OF THE PREFERRED EMBODIMENTS

Embodiment 1

Figure 1:
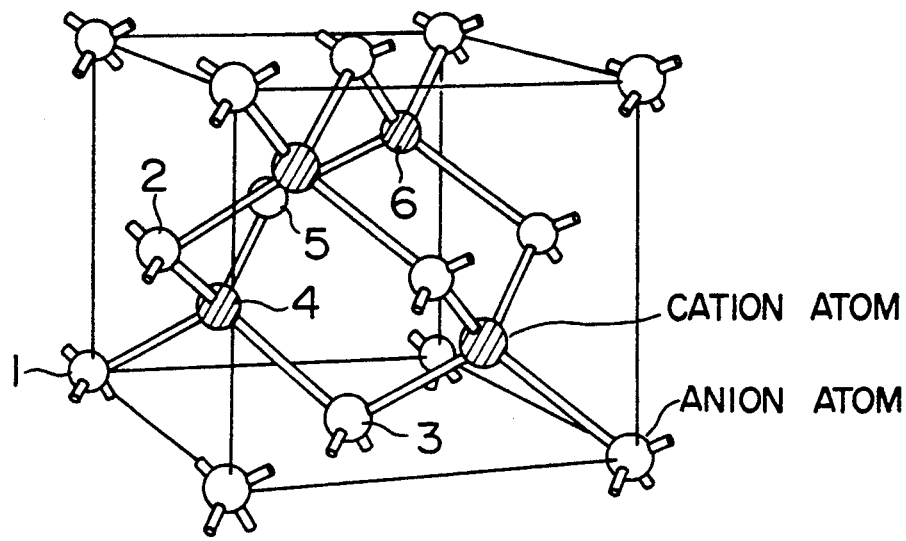
FIGS. 1 and 2 are diagrams showing crystal structures of a zincblende-structure and a wurtzite-structure, respectively.
Figure 2:
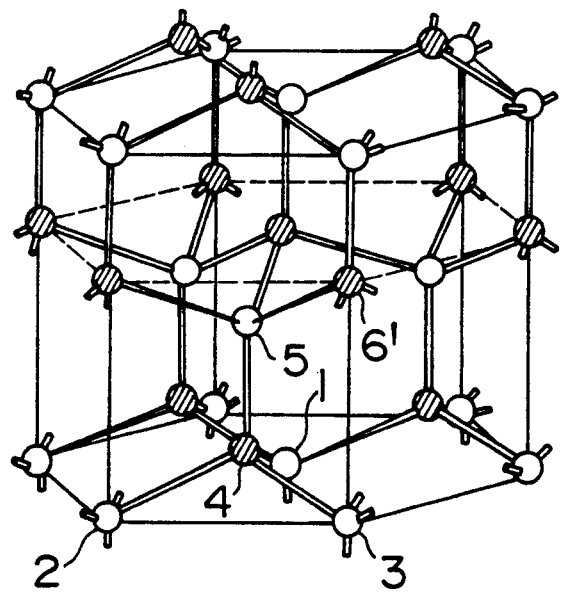
Figure 3:
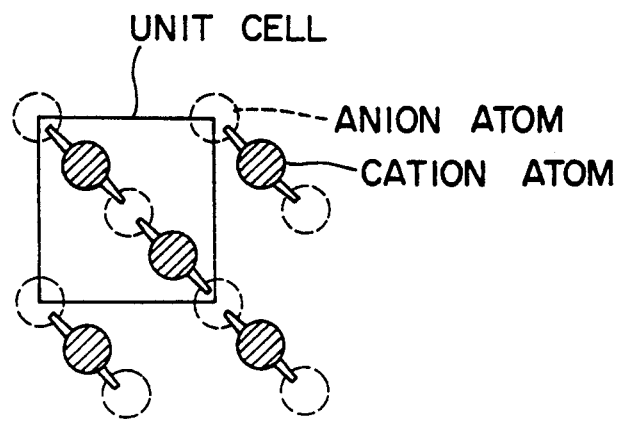
FIG. 3 is a view showing an atomic arrangement model in an epitaxial growth on the (100) face of a zincblend structure crystal.
Figure 4:
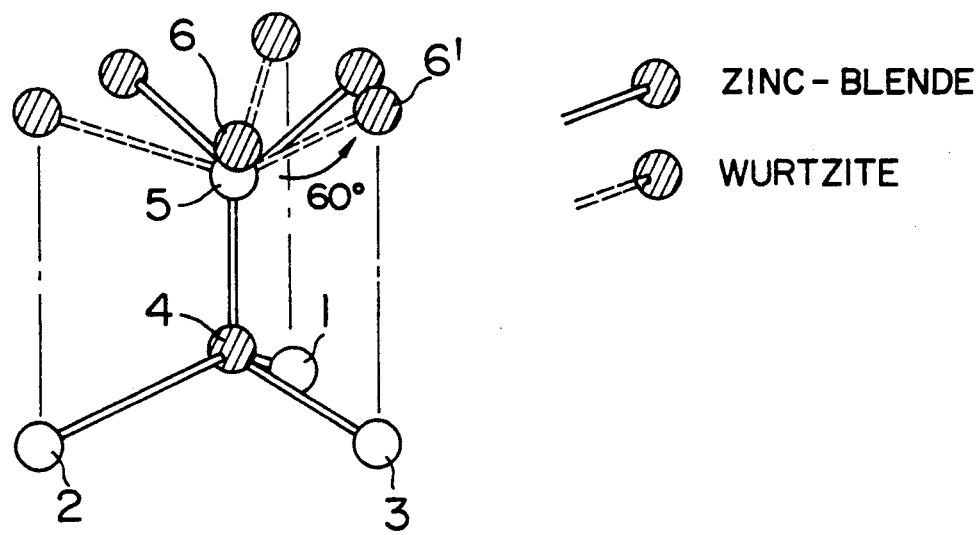
FIG. 4 is a view for explaining a difference between the respective atomic arrangements of the zincblende-structure and the wurtzite-structure.
Figure 5:
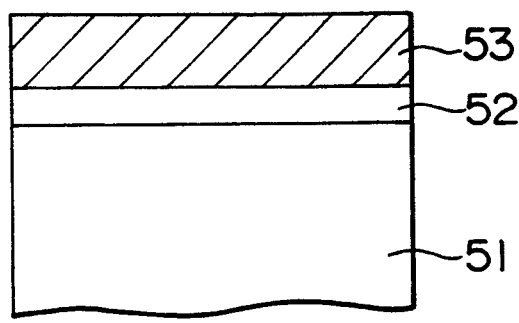
FIG. 5 is a sectional view of a hetero crystalline structure according to a first embodiment of the present invention.

Now referring to FIG. 5, this embodiment will be explained. A device for epitaxial growth may be an ordinary MBE (Molecular Beam Epitaxity) or ALE (Atomic Layer Epitaxy) device. Generally, the vacuum system of the MBE device is intensified in order to be used as the ALE device.

A GaAs substrate 51 of the zincblende-structure is prepared on a sample holder of the ALE device. A surface of the GaAs substrate is selected to be a (110) face. ALE vacuum deposition sources are metallic Ga, metallic As, metallic Cd, metallic Zn and S (sulfur) crystal. First, Ga molecular beams and As molecular beams are simultaneously supplied to the GaAs substrate at the epitaxial growth temperature of 600° C. and the epitaxial growth pressure of $10^{-10}$ Torr to epitaxially grow a GaAs buffer layer 52 0.1 μm thick. Next, the supply of the Ga molecular beams is stopped to prepare the GaAs buffer layer 52 the entire growing surface of which is covered with the anion atoms, i.e. a single atomic layer of As. Thereafter, the growth temperature is set to 400° C. and the growth pressure is set to $10^{-5}$ Torr in order to subsequently epitaxially grow CdZnS which is converted into the zincblende-structure in its crystal structure. Cd molecular beams and Zn molecular beams are supplied onto the GaAs buffer layer 52 to cover its growing surface with the cation atoms. S (sulfur) molecular beams are supplied to the thus obtained growing surface to cover the growing surface with the anion atoms. Thereafter, in like manner, the supply of Cd and Zn molecular beams and that of S molecular beams are alternately repeated to finally provide a CdZnS epitaxial layer 53 about 1 μm thick of the zincblende-structure. The process mentioned above also permits such an epitaxial layer to be formed to have a thickness of 10 μm or more. Additionally, the mixing ratio in the CdZnS alloy is set to $Cd_{0.58}Zn_{0.42}S$ by adjusting the intensities of the Cd molecular beams and the Zn molecular beams so that the lattice constant of the CdZnS epitaxial layer is equal to that of the GaAs substrate.

In this embodiment, the CdZnS epitaxial layer becomes an alloy semiconductor since Cd and Zn atoms which serve as cation atoms are simultaneously supplied onto the growing surface. However, an atomic layer super-lattice having one period of (CdS)(ZnS)(CdS)(ZnS)(CdS)(ZnS)(CdS)(CdS) may be made by supplying Cd, S, Zn, S, Cd, S, Zn, S, Cd, S, Zn, S, Cd, S, Cd and S to the growing surface in this order.

Embodiment 2

Figure 6:
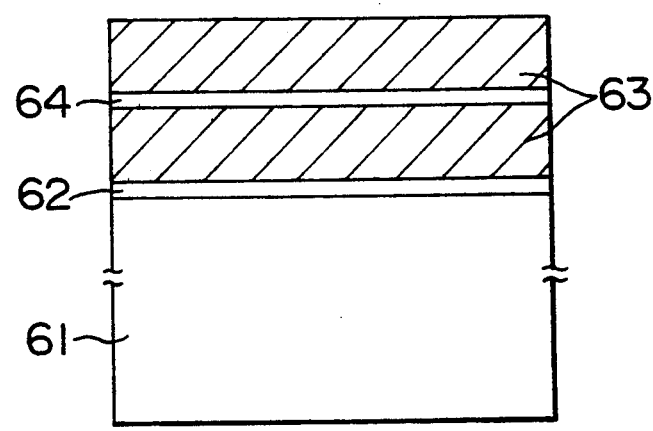
FIG. 6 is a sectional view of a double-hetero structure wafer for a semiconductor laser according to a second embodiment of the present invention.

FIG. 6 shows the section of a wafer of a double hetero structure according to a second embodiment of the present invention. In this figure, 61 is a GaAs substrate having a (100) face of the zincblende crystal structure; 62 is a GaAs buffer layer (0.1 μm thick), 63 is a $Cd_{0.58}Zn_{0.42}S$ cladding layer (1 μm thick) which has been converted into the zincblende-structure in its crystal structure; and 64 is a GaAs active layer (0.1 μm thick). This wafer is cleft to have an area of 30×250 μm². Optical pumping of the thus formed double-hetero structure by an argon ion laser at a wavelength of 5145 Å permits a laser light to be observed from the GaAs active layer. Further, current injection instead of optical pumping also permits a laser light to be observed as in ordinary semiconductor lasers.

Table 1 shows examples of combinations of the substrates and the epitaxial layers which provide a heterojunction. These epitaxial layers can be also formed by the ALE device in the same manner as in Embodiment 1.

TABLE 1

| substrate | | epitaxial layer | |
|---|---|---|---|
| material | crystalline structure | material | inherent crystalline structure |
| Ge | diamond structure | $Cd_{0.58}Zn_{0.42}S$ | wurtzite structure |
| InP | zincblende structure | $CdSe_{0.08}S_{0.92}$ | wurtzite structure |
| CdSe | wurtzite structure | InAs | zincblende structure |
| BP | zincblende structure | $In_{0.08}Ga_{0.92}N$ | wurtzite structure |

We claim:

1. A hetero crystalline structure comprising:
   a semiconductor single crystal substrate, a crystal face of said semiconductor substrate having an atomic arrangement which exists in one crystalline structure selected from the group consisting of a zincblende-crystalline structure and a wurtzite-crystalline structure, and
   a semiconductor single crystal epitaxial film epitaxially grown on said crystal face semiconductor substrate and having an atomic arrangement which exists in said one crystalline structure throughout its entire thickness, from an interface with said semiconductor substrate to an interface with a material of different composition, and being made of a different material therefrom, the material of said semiconductor single crystal epitaxial film not having said one crystalline structure in its bulk state.

2. A hetero crystalline structure according to claim 1, wherein said semiconductor single crystal substrate has a crystalline structure of a zincblende-structure and a crystal face of (100).

3. A hetero crystalline structure according to claim 1, wherein said semiconductor single crystal substrate has a crystalline structure of a zincblende-structure and a crystal face of (110).

4. A hetero crystalline structure according to claim 1, wherein said semiconductor single crystal substrate is made of III-V compound semiconductor.

5. A hetero crystalline structure according to claim 2, wherein said semiconductor single crystal substrate is made of III-V compound semiconductor.

6. A hetero crystalline structure according to claim 3, wherein said semiconductor single crystal substrate is made of III-V compound semiconductor.

7. A hetero crystalline structure according to claim 1, wherein said semiconductor single crystal epitaxial film is made of II-VI alloy semiconductor.

8. A hetero crystalline structure according to claim 2, wherein said semiconductor single crystal epitaxial film is made of II-VI alloy semiconductor.

9. A hetero crystalline structure according to claim 3, wherein said semiconductor single crystal epitaxial film is made of II-VI alloy semiconductor.

10. A hetero crystalline structure according to claim 1, wherein said semiconductor single crystal substrate is made of III-V compound semiconductor and said semiconductor single crystal epitaxial film is made of II-VI alloy semiconductor.

11. A hetero crystalline structure according to claim 2, wherein said semiconductor single crystal substrate is made of III-V compound semiconductor and said semiconductor single crystal epitaxial film is made of II-VI alloy semiconductor.

12. A hetero crystalline structure according to claim 3, wherein said semiconductor single crystal substrate is made of III-V compound semiconductor and said semiconductor single crystal epitaxial film is made of II-VI alloy semiconductor.

13. A hetero crystalline structure according to claim 1, wherein said semiconductor single crystal substrate is made of one selected from a group consisting of GaAs and InP.

14. A hetero crystalline structure according to claim 2, wherein said semiconductor single crystal substrate is made of one selected from the group consisting of GaAs and InP.

15. A hetero crystalline structure according to claim 3, wherein said semiconductor single crystal substrate is made of one selected from a group consisting of GaAs and InP.

16. A hetero crystalline structure according to claim 1, wherein said semiconductor single crystal epitaxial film is made of a material selected from the group consisting of CdSe, GaN, AlN, CdZnS, CdSeS, InAs, InGaN, and an alloy of GaN and AlN.

17. A hetero crystalline structure according to claim 2, wherein said semiconductor single crystal epitaxial film is made of a material selected from the group consisting of CdSe, GaN, AlN, CdZnS, CdSeS, InAs, InGaN, and an alloy of GaN and AlN.

18. A hetero crystalline structure according to claim 3, wherein said semiconductor single crystal epitaxial film is made of a material selected from the group consisting of CdSe, GaN, AlN, CdZnS, CdSeS, InAs, InGaN, and an alloy of GaN and AlN.

19. A semiconductor device wherein the hetero crystalline structure of claim 1 is used, the semiconductor single crystal epitaxial film of which works as an active layer or a cladding layer of a semiconductor laser.

20. A semiconductor device wherein the hetero crystalline structure of claim 2 is used, the semiconductor single crystal epitaxial film of which works as an active layer or a cladding layer of a semiconductor laser.

21. A semiconductor device wherein the hetero crystalline structure of claim 3 is used, the semiconductor single crystal epitaxial film of which works as an active layer or a cladding layer of a semiconductor laser.

* * * * *